(12) United States Patent
Benaissa et al.

(10) Patent No.: US 10,183,441 B2
(45) Date of Patent: Jan. 22, 2019

(54) METHOD FOR OBTAINING A WAVY LAYER LOCALLY SUSPENDED ON A SUBSTRATE USING A DEFORMATION BY FORMATION OF WRINKLES

(71) Applicant: COMMISSARIAT A L'ENERGIE ATOMIQUE ET AUX ENERGIES ALTERNATIVES, Paris (FR)

(72) Inventors: Lamine Benaissa, Massy (FR); Jean-Sebastien Moulet, Chambery (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 15/028,876

(22) PCT Filed: Oct. 16, 2014

(86) PCT No.: PCT/EP2014/072263
§ 371 (c)(1),
(2) Date: Apr. 12, 2016

(87) PCT Pub. No.: WO2015/055786
PCT Pub. Date: Apr. 23, 2015

(65) Prior Publication Data
US 2016/0251250 A1  Sep. 1, 2016

(30) Foreign Application Priority Data

Oct. 17, 2013 (FR) ...................................... 13 60110

(51) Int. Cl.
*B29C 61/00* (2006.01)
*H01L 41/113* (2006.01)
(Continued)

(52) U.S. Cl.
CPC .......... *B29C 61/00* (2013.01); *B28B 17/0009* (2013.01); *B32B 3/28* (2013.01);
(Continued)

(58) Field of Classification Search
CPC ....... B32B 3/28; B32B 3/30; H01L 21/02126; H01L 21/02164; H01L 31/0236;
(Continued)

(56) References Cited

U.S. PATENT DOCUMENTS 5,354,597 A * 10/1994 Capik ..................... A61F 13/58
428/152
5,376,430 A * 12/1994 Swenson ........... A61F 13/49009
428/152

(Continued)

OTHER PUBLICATIONS

Giust et al., "New ripple patterns observed in excimer-laser irradiated SiO2/polycrystalline silicon/SiO2 structures," Jun. 30, 1997, Applied Physics Lett. 80 (26), p. 3552-3554.*

(Continued)

*Primary Examiner* — Matthew J Daniels
*Assistant Examiner* — Andrew D Graham
(74) *Attorney, Agent, or Firm* — Oblon, McClelland, Maier & Neustadt, L.L.P.

(57) ABSTRACT

A method forming an elastic undulated layer locally lying on a substrate from a structure including a strained elastic layer on a foundation in a solid state present at a surface of a rigid substrate, the method including: melting a foundation for a duration of at least 50 ns, the foundation thickness being at least 20 nm and lower than a predetermined thickness corresponding to a theoretical peak-to-peak amplitude of wrinkles, the melting generating a simultaneous deformation, by forming wrinkles, of the elastic layer and the foundation and accompanied by localized adherent contact between the elastic layer and the rigid substrate in zones separating regions of the foundation; solidifying the foun- (Continued)

dation to bring it back to the solid state; removing the foundation brought back to the solid state to suspend a layer above the substrate outside the zones of localized adherent contact, the suspended layer being undulated in accordance with the wrinkles.

13 Claims, 6 Drawing Sheets

(51) Int. Cl.
| | | |
|---|---|---|
| B82B 3/00 | (2006.01) | |
| B32B 3/28 | (2006.01) | |
| B32B 3/30 | (2006.01) | |
| C03B 23/02 | (2006.01) | |
| G01L 1/16 | (2006.01) | |
| B28B 17/00 | (2006.01) | |
| H01L 21/302 | (2006.01) | |
| H01L 21/3105 | (2006.01) | |
| B29K 105/00 | (2006.01) | |

(52) U.S. Cl.
CPC ............. *B32B 3/30* (2013.01); *B82B 3/0033* (2013.01); *C03B 23/02* (2013.01); *G01L 1/16* (2013.01); *H01L 41/1132* (2013.01); *B29K 2105/256* (2013.01); *B32B 2250/02* (2013.01); *B32B 2307/51* (2013.01); *H01L 21/302* (2013.01); *H01L 21/3105* (2013.01)

(58) Field of Classification Search
CPC . H01L 31/02366; H01L 27/12; H01L 41/332; B29C 2035/0838; B29C 2791/009; B29C 61/00; B29C 61/06; B29C 61/0616; B81C 1/00103; B81C 2201/0105
USPC ......................................................... 264/485
See application file for complete search history.

(56) References Cited

U.S. PATENT DOCUMENTS

| | | | | |
|---|---|---|---|---|
| 7,557,367 B2* | 7/2009 | Rogers | ................... | B82Y 10/00 257/40 |
| 8,792,169 B2* | 7/2014 | Jiang | ........................ | C23C 14/34 359/566 |
| 2002/0006560 A1* | 1/2002 | van der Schaar | ..... | G03F 9/7053 430/22 |
| 2003/0031443 A1* | 2/2003 | Soljacic | ........... | B29D 11/00721 385/125 |
| 2003/0035972 A1* | 2/2003 | Hanson | ..................... | B32B 7/02 428/480 |
| 2004/0079941 A1* | 4/2004 | Yamazaki | ........... | H01L 27/1214 257/40 |
| 2004/0095621 A1* | 5/2004 | Funada | ................... | B29C 59/02 359/1 |
| 2004/0184138 A1* | 9/2004 | Schrader | .............. | G02B 26/001 359/321 |
| 2004/0212869 A1* | 10/2004 | Srinivasan | ........... | G02B 5/1828 359/295 |
| 2007/0164632 A1* | 7/2007 | Adachi | ................ | A61B 8/4483 310/311 |
| 2008/0090421 A1* | 4/2008 | Casset | ................. | B81C 1/00103 438/703 |
| 2008/0138013 A1* | 6/2008 | Parriaux | .............. | G02B 5/1814 385/37 |
| 2008/0157235 A1* | 7/2008 | Rogers | ................ | H01L 21/8258 257/415 |
| 2010/0002402 A1* | 1/2010 | Rogers | ................ | H01L 21/4867 361/749 |
| 2010/0052112 A1* | 3/2010 | Rogers | .................. | B81B 7/0093 257/625 |
| 2013/0186467 A1* | 7/2013 | Saeki | ..................... | B29C 33/424 136/259 |
| 2013/0299796 A1* | 11/2013 | Masuyama | ......... | B29C 33/3857 257/40 |
| 2013/0334511 A1* | 12/2013 | Savas | ..................... | H01L 51/56 257/40 |

OTHER PUBLICATIONS

Serrano et al., "Micron-scale buckling of SiO2 on Si," Dec. 15, 2002, Journal of Applied Physics, p. 7606-7610.*
G. K. Giust, et al., "New ripple patterns observed in excimer-laser irradiated SiO$_2$/polycrystalline silicon/SiO$_2$ structures," Applied Physics Letters, vol. 70, No. 26, Jun. 30, 1997, pp. 3552-3554.
E. Epp, et al., "Hollow Bragg waveguides fabricated by controlled buckling of Si/SiO$_2$ multilayers," Optics Express, vol. 18, No. 24, Nov. 22, 2010, pp. 24917-24925.
Justin R. Serrano, et al., "Micron-scale buckling of SiO$_2$ on Si," Journal of Applied Physics, vol. 92, No. 12, Dec. 15, 2002, pp. 7606-7610.
Y. F. Lu, et al., "Controllable laser-induced periodic structures at silicon-dioxide/silicon interface by excimer laser irradiation," XP-002726614, Journal of Applied Physics, vol. 80, No. 12. Dec. 15, 1996, pp. 7052-7056.
J. J. Yu, et al., "Laser engineered rippling interfaces for developing microtextures, adherent coatings and surface coupling," XP-002726615, SPIE, vol. 3898, Dec. 1999, pp. 252-262.
G. E. Jellison, Jr., "Time-resolved optical studies of oxide-encapsulated silicon during pulsed laser melting," XP-002726616, Journal of Materials Research, vol. 3, No. 3, 1988, pp. 498-505.
Luka Pocivavsek, et al., "Stress and Fold Localization in Thin Elastic Membranes," Science, vol. 320, 2008, 7 pages.
French Search Report dated Jul. 3, 2014 in FR 13 60110 Filed Oct. 17, 2013.
International Search Report dated Dec. 19, 2014 in PCT/EP14/72263 Filed Oct. 16, 2014.

* cited by examiner

METHOD FOR OBTAINING A WAVY LAYER LOCALLY SUSPENDED ON A SUBSTRATE USING A DEFORMATION BY FORMATION OF WRINKLES

TECHNICAL FIELD

The field of the invention is that of the manufacture of suspended structures, and in particular structures comprising an undulated layer which locally lies on a substrate by being suspended above the substrate outside of zones of localized adherent contact.

The invention more precisely relates to a method for manufacturing locally suspended structures, this method relying on the formation of undulations at the surface of a substrate, these undulations being commonly designated by the term wrinkles and being characterized by an amplitude, a wavelength and an orientation.

STATE OF PRIOR ART

Structures locally suspended above a substrate can be deformed under pressure. Such structures find application when a deformation is required, for example to reduce the strength of a contact zone and thus to improve the reliability thereof, or even when the deformation of such a suspended layer is accompanied by a physical phenomenon such as for example a piezoelectric effect.

Such structures are generally obtained by lithography. But, non-lithographic approaches based on self-organization thermodynamic processes appear to be particularly attractive given their economic potential and their compatibility with the large scale production.

DISCLOSURE OF THE INVENTION

The purpose of the invention is to provide a rather simple and readily reproducible technique for the manufacture of an undulated layer locally suspended above a substrate.

To that end, it provides a method for forming an undulated layer locally lying on a substrate from a structure comprising a strained elastic layer on a foundation in the solid state present at the surface of a rigid substrate, characterized by the implementation of the steps of:

melting the foundation to bring it to the liquid state for a duration higher than or equal to 5 ns, the thickness of the foundation being at least 20 nm and lower than a predetermined thickness corresponding to a theoretical peak-to-peak amplitude of wrinkles, said melting resulting in a stress relaxation of the elastic layer which generates a simultaneous deformation, by formation of wrinkles, of the elastic layer and of the foundation, the formation of the wrinkles being accompanied by a localized adherent contact between the elastic layer and the rigid substrate in zones separating regions of the foundation;

solidifying the foundation to bring it back to the solid state, said solidification forming a solid structure having wrinkles at the surface;

removing the foundation brought back to the solid state for suspending a layer above the substrate outside of zones of localized adherent contact, the suspended layer being undulated in accordance with the wrinkles at the surface of the solid structure.

Some preferred but in no way limiting aspects of this method are the following ones:

the melting is made by means of a selective energy supply according to which the energy is absorbed by the foundation rather than by the strained elastic layer with a ratio of 100/1, preferably with a ratio of 1000/1;

the duration of each of the melting and solidification steps is lower than 1 second, preferably lower than to 1 microsecond;

a thermally insulating layer is inserted between the foundation and the rigid substrate;

the foundation being electrically conducting and inserted between electrically insulating materials, the melting of said at least one part of the foundation is made by a thermal energy supply making use of the joule effect;

the foundation being inserted between electrically conducting materials and having a resistivity higher than that of said electrically conducting materials, the melting of said at least one part of the foundation is made by a thermal energy supply making use of a resistive heating;

the melting and solidification steps are reiterated before the step of removing the foundation brought back to the solid state, so as to increase the amplitude of the wrinkles and the interval between the separated regions of the foundation without reaching the yield point of the elastic layer;

the removal of the foundation brought back to the solid state is made by selectively etching the foundation with respect to the rigid substrate and with respect to an undulated layer lying on the foundation and locally on the rigid substrate;

the suspended layer is formed by the elastic layer;

it comprises before removing the foundation, a step of removing the elastic layer followed by a step of depositing a new layer at the surface of the substrate and of the foundation, said new layer forming the suspended layer after removing the foundation;

the elastic layer initially has a stress having a discontinuity in the plane of the layer;

it comprises a step of creating patterns at the surface of the elastic layer and/or of the foundation to induce said discontinuity.

BRIEF DESCRIPTION OF THE DRAWINGS

Further aspects, purposes, advantages and characteristics of the invention will better appear upon reading the following detailed description of preferred embodiments thereof, given by way of non limiting example, and made with reference to the appended drawings in which.

DETAILED DISCLOSURE OF PARTICULAR EMBODIMENTS

The invention relates to the original idea of using a surface structuring method to result in the formation of an undulated layer locally suspended above a substrate.

The surface structuration finds application in numerous fields, such as the field of electronics where in particular it enables components to be miniaturized, or even in the field of optics where it enables for example the efficiency of light collection by photovoltaic cells to be improved.

Figure 1A:
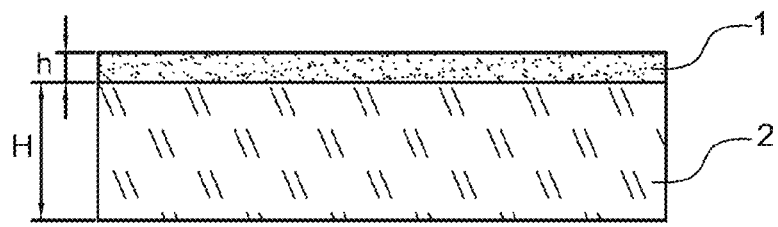
FIGS. 1a-1c illustrate the surface structuration by forming wrinkles.
Figure 1B:
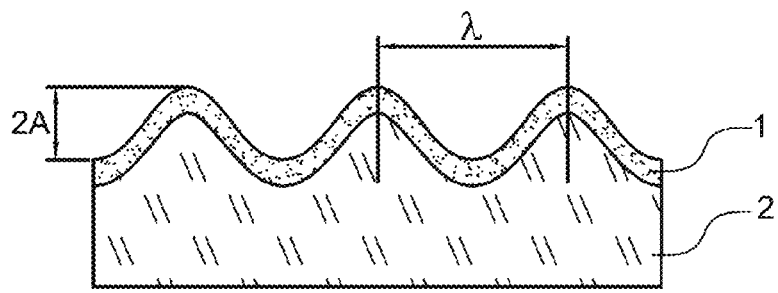
Figure 1C:
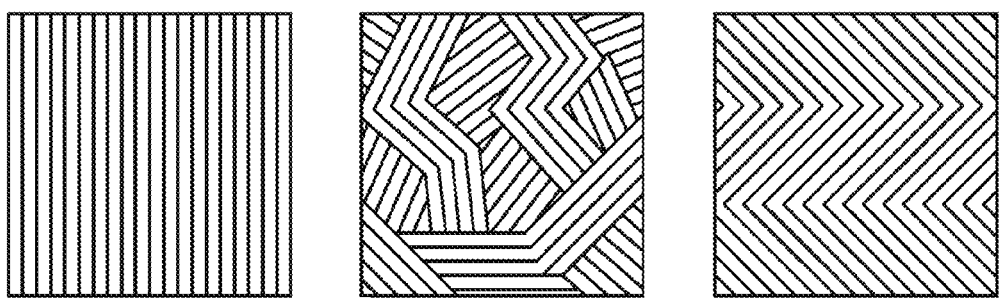

The surface structuration can follow a non-lithographic approach based on thermodynamic self-organization processes. One example of such an approach illustrated in FIGS. 1a-1c relies on the deformation of an elastic thin layer 1 with a thickness h attached to a thicker support 2, with a thickness H, designated in the following by the term foundation. This deformation has as its driven force a strain which relative to the elastic layer corresponds to a compressive strain of the foundation on the layer. This stress introduces an instability of the elastic layer/foundation system and results in the formation of wrinkles characterized, as represented in FIG. 1b, by their wavelength $\lambda$ and their amplitude A (corresponding to half peak-to-peak height 2A). As represented in FIG. 1c, the wrinkles are also characterized by their orientation O that can have the form of strips (on the left), labyrinths (in the centre) or chevrons (on the right).

The theory of wrinkles describes two modes according to which the elastic layer/foundation system will manage this instability.

When both the thin layer 1 and the foundation 2 are elastic, the system spontaneously changes to minimize its energy. Within this context, the emergence of wrinkles of a given wavelength corresponds to a trade-off between the flexural energy of the system and the energy required to deform the surface of the foundation. The formation of the wrinkles is in the first order dictated by the elastic module ratio between the skin and the foundation, their thickness ratio and the intensity of the stress to be relaxed by the system. The lower the foundation stiffness, the lower is the critical stress required to form the wrinkles.

In practice, materials with exceptional properties (elastic properties and low stiffness) are thus required such as elastomers to observe wrinkles. A strongly strained thin layer on a rigid foundation will actually tend to produce a deflection rather than wrinkles.

On the other hand, it is to be noted that once the wrinkles are formed, the system is in equilibrium. The removal of the thin layer then causes a spontaneous return of the elastic foundation to its initial state, that is without wrinkles.

When the foundation is viscous, the formation of wrinkles is caused for much lower stresses and the system energy is namely dissipated by a viscous flow of the foundation. Unlike the elastic/elastic system, the amplitude of the wrinkles is in this case subjected to a kinetics which is governed by the relaxation module of the viscous foundation. Hence, the amplitude of the wrinkles is restricted, and in practice incompatible with the intended applications.

In practice, the understanding of the elastic/viscous system enabled strategies for removing low amplitude wrinkles to be developed. For example, by transferring strained films on ad hoc foundations, it is possible to reverse the wrinkle formation process. This makes it possible for example for single crystal films to allow a relaxation by lateral expansion rather than by the formation of dislocations.

There is for this second mode a particular case which corresponds to the limit condition of a liquid foundation. A strained thin film deposited on a liquid indeed systematically forms wrinkles at the surface in view of the low relaxation module of the liquid. The handling of such a system (thin layer on liquid) is however sensitive, which nowadays restricts applications to laboratory studies and/or characterization of thin films.

For these different relaxation modes, there are analytical or semi-analytical solutions which enable the wavelength and the amplitude of the wrinkles formed to be accurately described. As regards orientation, numerous studies report that in-plane stress ruptures are the origin of favoured orientations. Thus, creating a low-relief or even defining patterns enables the wrinkles along the in-plane stress field distribution to be accurately oriented.

In the light of the above, the surface structuring methods by formation of wrinkles are today mainly restricted to some types of polymers, whereas for other materials, the low amplitude of the wrinkles obtained (typically in the order of 10 nm, namely lower than 20 nm peak-to-peak) remains incompatible with the intended applications or complex to implement for a large scale production.

Within the scope of the invention, it is provided to employ a method of forming wrinkles which enables the surface structuration by forming wrinkles to be extended to materials other than polymers, such as metals, semi-conductors, oxides, in a readily reproducible manner and with a structuring amplitude which is easily exploitable, that is greater than 30 nm (that is 60 nm peak-to-peak) and more typically an amplitude higher than 100 nm (that is higher than 200 nm peak-to-peak).

Figure 2A:
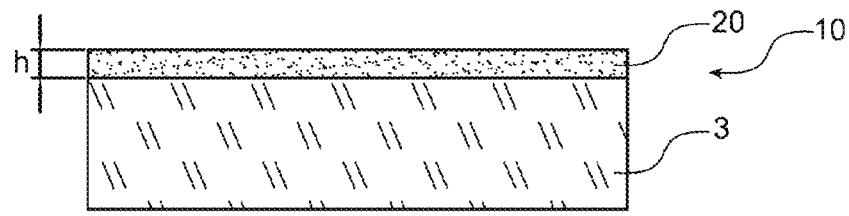
FIGS. 2a-2d illustrate an exemplary method of forming wrinkles.
Figure 4A:
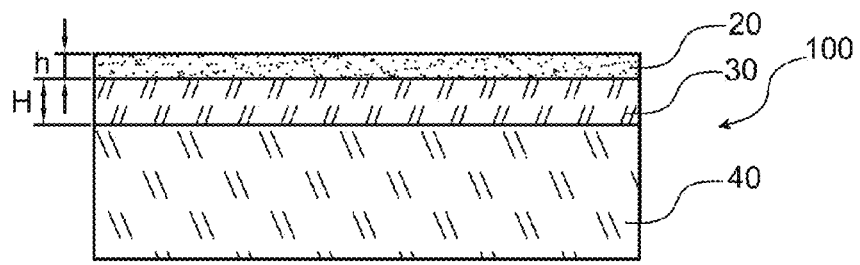
FIGS. 4a-4c illustrate a melting/solidification cycle that can be implemented in the method according to the invention.

Referring to FIG. 2a (not part of the invention) and FIG. 4a (which illustrates the invention), the invention relies on a surface structuring method of a bilayer structure 10, 100 initially comprising a strained layer 20 on a foundation in the solid state 3, 30. The strained layer 20 is more particularly an elastic layer with a thickness h whereas the foundation can take the form of a substrate 3 as represented in FIG. 2a, or a layer 30 with a thickness H formed at the surface of a rigid substrate 40 as represented in FIG. 4a.

The strained elastic thin layer 20 has more particularly a tensile stress in at least one direction of the plane of the thin layer, or even a compressive stress only in one direction of the plane.

The elastic thin layer 20 can be formed by implementing a deposition onto the foundation 3, 30, or even be formed by implementing a chemical reaction at the surface of the foundation (for example oxidation, nitration, carburation, etc.). The stress of the elastic thin layer is in particular related to a lattice parameter mismatch of the materials making up the foundation and the thin layer, and can be adjusted by varying the formation conditions of the thin layer, for example via the temperature of the deposition which generates a more or less high heat stress depending on the difference of the heat expansion coefficients of the thin layer and of the foundation.

Figure 2B:
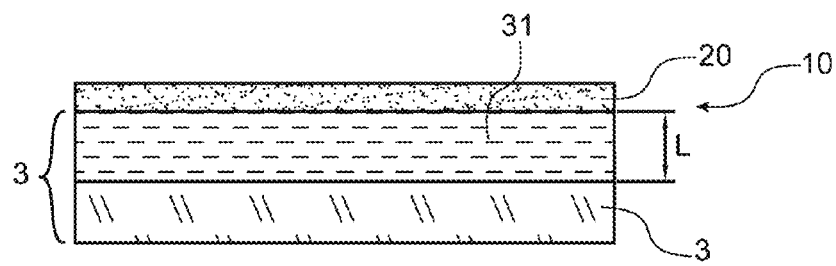
Figure 4B:
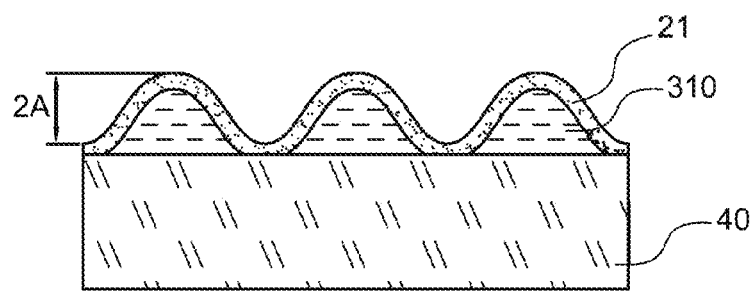

Referring to FIG. 2b (not part of the invention) and FIG. 4b (which illustrates the invention), the method according to the invention comprises a step of melting at least part of the foundation to bring it to the liquid state, said at least part being in contact with the strained elastic layer.

Said at least part of the foundation brought to the liquid state has a thickness L, and can correspond in an illustrative example to an upper layer 30 of a foundation in the form of a substrate 3 in contact with the elastic thin layer (FIG. 2*b*) or even within the scope of the invention, to an entire foundation as a layer 30 with a thickness H at the surface of a rigid substrate 40 (FIG. 4*b*).

Figure 2C:
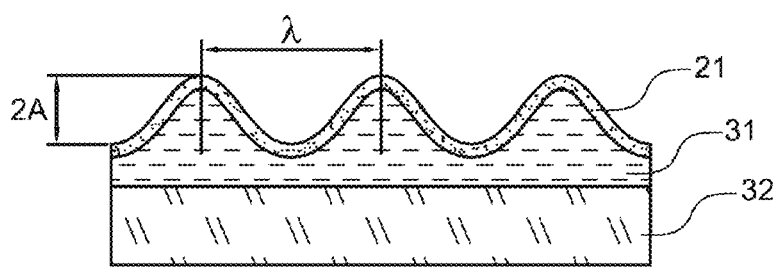

As illustrated in FIG. 2*c* (not part of the invention) and in FIG. 4*b* (which illustrates the invention), said at least part which is now liquid 31, 310 mechanically decouples the strained elastic thin layer 20 from a solid part consisting of the non-molten solid part 32, of the foundation substrate 3, or even consisting of the rigid substrate 40 under the layer-foundation 30. During the melting time, the bilayer structure 10, 100 is positioned in the limit condition corresponding to an elastic thin layer/viscous foundation theoretical relaxation with an infinite relaxation time. The stress relaxation of the elastic layer generates a simultaneous deformation of the elastic layer and said at least liquid part of the foundation. The liquid character allows and promotes the formation of wrinkles rather than a flexural deformation. To obtain an amplitude structuring higher than 30 nm, it is required that the thickness L made liquid is higher than or equal to 20 nm, advantageously higher or equal to 30 nm, and that the duration during which this layer is liquid is at least 50 ns to enable a maximum relaxation of the thin layer 20. The higher the thickness L of the foundation made liquid, the more the amplitude of the intended wrinkles can grow. There is however a maximum value Lmax of the thickness made liquid beyond which the amplitude of the wrinkles cannot grow any more, this maximum amplitude being dictated by the theory of wrinkles in the homogenous linear growth regimen of the amplitude. By way of illustrating example, for an intended wrinkle amplitude higher than 75 nm, a thickness L typically in the order of 50 to 100 nm is chosen.

Figure 2D:
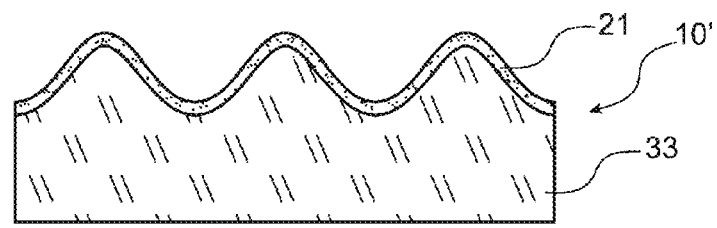
Figure 4C:
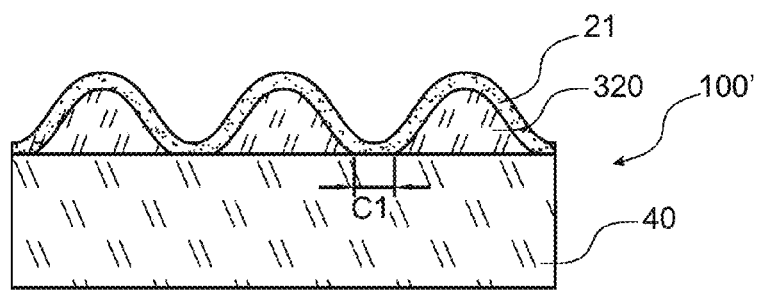

As illustrated in FIG. 2*d* (not part of the invention) and in FIG. 4*c* (which illustrates the invention), the method then comprises solidifying said at least part 21, 310 of the foundation to bring it back to the solid state, said solidification forming a solid structure 10', 100' having surface wrinkles. This return to the initial conditions (solid state of the foundation) enables the wrinkles formed to be fixed.

The melting step can be more particularly made by selectively feeding energy such that the energy is mainly absorbed by said at least part of the foundation with the thickness L rather than the strained elastic layer and than the underlying rigid substrate 40 if appropriate, for example with a ratio of at least 100/1, preferably with a ratio of at least 1000/1.

The thin layer preferably has a melting temperature higher than the melting temperature of the foundation. Likewise, the rigid substrate 40 supporting in the second embodiment a layer-foundation 30 has also preferably a melting temperature higher than the melting temperature of the foundation. Alternatively, or in addition, a thermally insulating intermediate layer can be inserted between the layer-foundation 30 and the rigid substrate 40 so as to insulate the rigid substrate 30 from thermal phenomena. Once again, the thermally insulating intermediate layer preferably has a melting temperature higher than the melting temperature of the foundation.

The foundation can have a combination of two or more materials, so as to reduce the melting temperature thereof or even to improve the energy supply absorption thereof. By way of illustrating example, a silicon doping enables the melting temperature thereof to be lowered.

The thin layer can also have a combination of two or more materials. The combination of materials can have equivalent average physical properties (Young modulus, Poisson, and stress) enabling the intended structure to be adjusted at best according to the theory of wrinkles and/or can have an average behaviour relative to the energy source such that the energy absorption ratio is at least 1/100 ideally 1/1000 towards the foundation.

The duration of the melting step is typically between 50 ns and 1 s, advantageously between 50 ns and 1 ms. Short durations are favoured to avoid a temperature rise in the entire foundation and to alter too much the mechanical properties of the thin layer. For equivalent configurations, the thickness of the foundation made liquid and the duration in the liquid state are the two main parameters enabling the amplitude of the wrinkles to be adjusted.

The duration of the cooling step is also advantageously controlled to remain lower than 1 s, advantageously lower than 1 ms, in order to preserve the wrinkles during cooling. This duration can in particular be adapted to the intended period of the wrinkles. Indeed, the higher the cooling duration, the higher is the wavelength of the wrinkles. The cooling can thus be slowed down, for example by one or more energy supplies during this period, as a function of the intended period.

According to the nature of the materials concerned, the melting can be achieved by employing a laser energy source at a chosen wavelength to ensure a selectivity of the energy supply depending on the thickness and absorption of the materials in question, or even by employing an induction magnetic source or a microwave source. By way of illustrating example, a laser source can be used emitting in the ultra-violet, for example at a wavelength of about 300 nm, when the thin layer, for example of $SiO_2$, is transparent to ultra-violets and the foundation rather absorbs this light, for example when it is made up of silicon.

When the foundation is electrically conducting (this is the case in particular when it is metallic, for example of copper) and inserted between electrically insulating materials (thin layer on one side, intermediate layer and/or rigid substrate 40 on the other side), the melting of said at least part of the foundation can be made by a thermal energy supply making use of the joule effect. When the foundation is inserted between electrically conducting materials (thin layer on one side, intermediate layer and/or rigid substrate 40 on the other side) and has a resistivity higher than that of said electrically conducting materials, the melting of said at least part of the foundation can be made by a thermal energy supply making use of a resistive heating.

The amount of energy required for melting all or part of the foundation can be predetermined by detecting the phase change of all or part of the foundation of a standard structure, for example by means of a reflectivity, resistivity, density, etc. measurement.

The wrinkles created are characterized by their wavelength $\lambda$, their amplitude A and their orientation O according to the theory of wrinkles, and are mainly related to the physical parameters of the thin layer and of the foundation in its liquid phase.

A thin layer of $SiO_2$ (skin) with a thickness h of 50 nm and a tensile stress of 200 MPa is considered by way of illustrating example. The foundation is of amorphous Si and molten on a thickness L of 150 nm in contact with the thin layer.

The calculations given here are within the scope of a structure comprising an elastic film on a viscous/liquid foundation. The foundation is made liquid by melting from its solid phase using a focused energy supply, typically a laser one (UV 308 nm, 150 ns pulse, 0.8 J·cm-2 energy). The silicon foundation absorbs most of the energy supply provided, the $SiO_2$ skin remains transparent to the working wavelength.

| Thin layer | | |
|---|---|---|
| Young modulus | Ep | 80 GPa |
| Poisson | Np | 0.17 |
| Initial stress | Cp | 200 MPa |
| Liquid foundation | | |
| Young modulus | Ef | 120 GPa |
| Relaxation module | µf | 50 MPa |
| Poisson | Np | 0.22 |

Period of the Wrinkles

When the thermodynamic conditions are compatible with the formation of wrinkles, the most favourable oscillation period to the system is instantaneously reached. Within the scope of the invention, the period is then set upon cooling, during which it is considered that the foundation is in a viscous state. The period of the wrinkles λ is defined by the formula below, from the publication by R. Huang entitled "Kinetic wrinkling of an elastic film on a viscoelastic substrate", Journal of Mechanics and Physics of Solids, 2004

$$\lambda = 2\pi h \left[ \frac{(1-\nu_f)}{6(1-\nu_p^2)} \frac{E_p}{\mu_f} \right]^{1/3}$$

The instantaneous character of the setting up of the period implies that this will change over time if the parameters defining it change over time, in particular µf, viscous relaxation module of the foundation. µf is defined by the following formula:

$$\mu_f = E_f / 2(1+\nu_f)$$

In the dynamic system investigated, where the foundation switches from its solid phase to its liquid phase and then to its solid phase again, the foundation has its relaxation module dramatically changed. According to Huang 2004, it can be estimated that µf varies over more than five orders of magnitude, that is $50.10^9$ Pa for its liquid phase to a few $50.10^4$ Pa for its viscous/liquid phase. The period λ consequently changes over time to be fixed during the return to the solid phase of the foundation about a value corresponding to an "average value" of µf estimated to $50.10^6$ Pa. Thus, in this case, the calculated oscillation period is λ=1.879 µm which corresponds to what is observed.

Amplitude of the Wrinkles

The growth of the amplitude of the wrinkles is a kinetic phenomenon. It is all the more quick that the foundation is in its liquid state. Thus, in the example investigated where the melting time is in the order of 500 ns, the amplitude of the oscillations can reach its maximum value described in the case of an elastic skin/liquid foundation system.

The following formula can then be used, according to the publication by Cerda & Pociavesk, Science, "Stress and Fold Localization in Thin Elastic Membranes", 2008:

$$A = \frac{\sqrt{2}}{\pi} \lambda \sqrt{\frac{\Delta}{W}},$$

with $$\Delta = \frac{|\sigma_p| \cdot W}{E_p}$$

representing the skin contraction distance.

When calculating the distance Δ, the Young modulus of the skin intervenes. Although this is a case where the energy application is quick (150 ns pulse) and the entire method lasts less than 1 µs, it is reasonable to consider here that when the foundation is liquid, the estimated Young modulus of the skin is lowered by one order of magnitude, from $80.10^9$ Pa to $8.10^9$ Pa. An amplitude A of 134 nm is then calculated, that is a peak-to-peak height of 268 nm.

Figure 3:
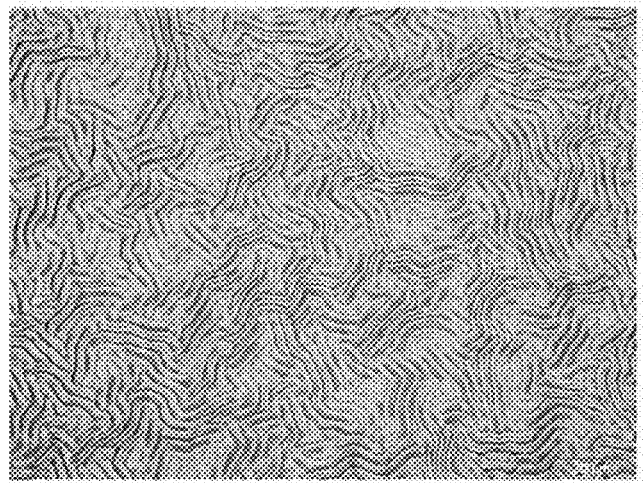
FIG. 3 represents wrinkles formed at the surface of a substrate according to the exemplary method of forming wrinkles of FIGS. 2a-2d.

In this regard, FIG. 3 illustrates the formation of wrinkles with a wavelength of about 2 µm and a peak-to-peak amplitude of 268 nm.

This peak-to-peak amplitude thus corresponds to a theoretical peak-to-peak amplitude of the wrinkles which may be predetermined, and be used to define the thickness L of the foundation intended to be molten in its liquid phase.

Thus, within the scope of the example of FIGS. 2a-2d where the foundation takes the form of a substrate 3, when the molten thickness L is lower than a predetermined thickness corresponding to the theoretical peak-to-peak amplitude of the wrinkles, the wrinkles formed then have a peak-to-peak amplitude lower than the theoretical peak-to-peak amplitude. The control of the molten thickness thus enables the amplitude of the wrinkles formed to be controlled.

Within the scope of the invention, the foundation takes the form of a layer 30 lying on a substrate 40, and the thickness H of the layer 30 is lower than the predetermined thickness corresponding to the theoretical peak-to-peak amplitude of the wrinkles. The formation of the wrinkles is then accompanied as represented in FIGS. 4b and 4c by a localized contact between the thin layer 21 and the rigid substrate 40 separating regions of the foundation 320 between zones of localized contact C1 of the layer 21 and the substrate. When the theory predicts a theoretical peak-to-peak amplitude of about 268 nm, from a $SiO_2$ thin layer of a 50 nm thickness and with an initial tensile stress of about 200 MPa and a layer foundation with a 150 nm thickness, a peak-to-peak amplitude limited to 230 nm has been observed This contact is transformed in adherence when the surfaces of the thin layer and of the substrate are smooth, for example with a surface roughness lower than 5 nm RMS, or even making a further thermal energy supply for enhancing the adherence, or even via the reiteration of the melting step.

In one exemplary application, the separated regions of the foundation 30 can further be used as a hard mask upon etching when the foundation 30 and the substrate 40 have a selectivity relative to a chemical etching.

Within the scope of the invention, the method comprises, at the end of a melting/solidification cycle, a step of removing the foundation brought back to the solid state to suspend the elastic layer 21 above the substrate outside of the zones of localized adherent contact C1.

The material(s) making up the substrate 40, the foundation 30 and the elastic layer 20 can in particular be chosen such that the foundation 30 has with respect to the elastic layer 20 and to the substrate 40 a strong selectivity towards etching, typically a selectivity higher than 1000/1. The method according to the invention consequently includes a step of etching the solid material 320 of the foundation lying under the thin layer 21 to form a structure consisting of the substrate 40 and the thin layer suspended above the substrate outside of the zones of localized adherent contact. Such a structure turns out to be interesting in particular when a deformation of such a suspended layer is accompanied by a physical phenomenon such as for example a piezoelectric effect. Etching the foundation requires to release access to the foundation. This access is typically made by positioning an etching mask and make an etching of the thin layer unprotected by the mask to provide an aperture, for example as a trench, towards the material of the foundation. The arrangement of wrinkles can in some cases facilitate this etching step. Thus, when they are arranged at least locally as parallel lines, one can choose to make at least one trench perpendicular to the wrinkles to facilitate access of the etching solution. Etching the foundation is then made, which results in the etching agent penetrating along the wrinkles beneath the thin layer.

It will be noticed that the method can comprise before removing the foundation, a removal of the elastic layer (for example by selective etching with respect to the foundation and the substrate) and then depositing a new layer onto the foundation and the substrate. This new layer also takes the form of an undulated layer in accordance with the wrinkles and in localized adherent contact with the substrate. This new undulated layer will form the locally suspended layer after removing the foundation.

Alternatively, one or more layers can be deposited on the undulated layer, before or after removing the foundation.

Generally, the undulated layer (thin layer, or new deposited layer) can be a multilayer structure, for example a structure comprising a layer of piezoelectric material sandwiched between two metal layers. And after removing the foundation, the undulated layer locally lying on the substrate can be covered with one or more layers, for example packaging layers.

Orientation of the Wrinkles

Figure 5A:
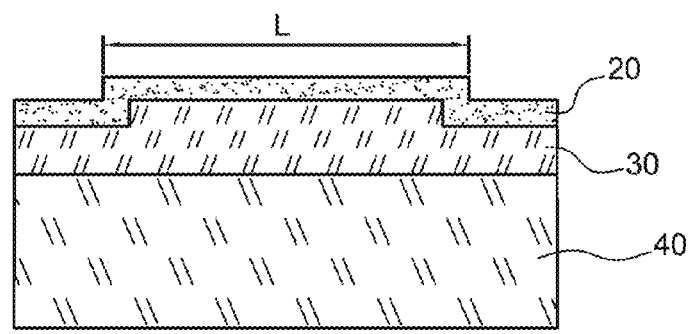
FIGS. 5a-5b illustrate the creation of a low-relief to orient the wrinkles formed at the surface of a substrate in one implementation of the method according to the invention.
Figure 5B:
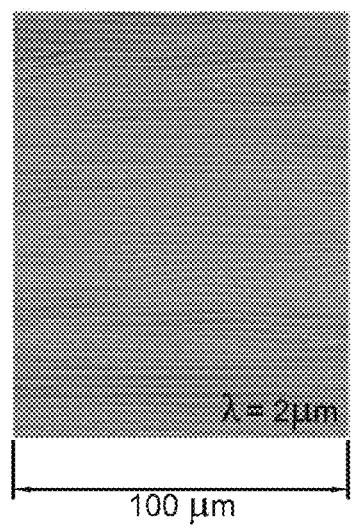

As regards the orientation O of the wrinkles, a favoured orientation of structuration can be defined by having an elastic layer the stress of which initially has a discontinuity in the plane of the layer, preferably stress discontinuities in a single direction of the plane spaced apart by a length lower than 2000 times the thickness h of the layer. In FIG. 5a, a low-relief is represented introducing such stress discontinuities, here spaced apart by 100 µm, with a layer-foundation 30 having a thickness 150 nm at a low-relief and of 70 nm elsewhere. FIG. 5b illustrates the formation of wrinkles oriented in quasi-parallel from a strained thin layer 20 of $SiO_2$ with a thickness of 50 nm and having an initial tensile stress of 100 MPa, of a layer-foundation 30 of Si having the low-relief of FIG. 5a and lying on a substrate 40 of Si including at the surface a thermally insulating intermediate layer of $SiO_2$.

In one embodiment, the method can comprise an initial step of creating patterns at the surface of the electric layer and/or the foundation to induce said stress discontinuity. This creation of patterns is for example made by means of a laser line.

In an exemplary application, the thin layer and the foundation can be chosen so as to have a selectivity relative to etching, for example dry wet etching, which enables removal of the skin or of the foundation to be made. Insofar as, at the end of the solidification step, the structure formed 10', 100' remains fixed, such a removal does not result in the disappearance of the wrinkled surface structuration.

In an exemplary application not being part of the invention, when the foundation takes the form of a layer 30 lying on a rigid substrate 40, the foundation and the substrate can be chosen so as to have a low selectivity, preferably a zero selectivity, relative to etching, for example a dry wet etching. In such a manner, after possibly removing the thin layer when it neither has a low selectivity relative to the etching retained, the surface structuration is transferred from the foundation to the substrate.

One alternative of the method according to the invention where the foundation takes the form of a layer 30 lying on a substrate 40 the molten thickness H of which is lower than the predetermined thickness corresponding to the theoretical peak-to-peak amplitude of the wrinkles, is detailed hereinafter in reference to FIGS. 6a-6e.

Figure 6A:
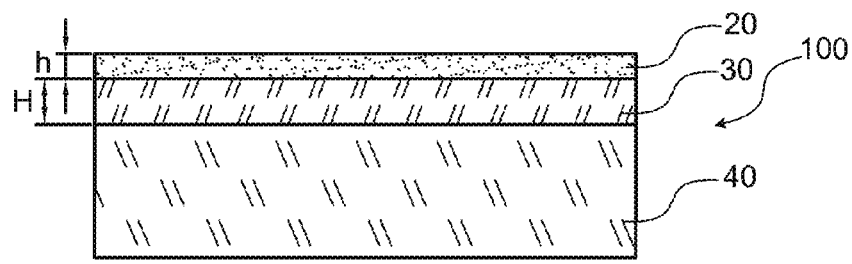
FIGS. 6a-6e illustrate an alternative of the second possible embodiment of the method according to the invention making use of a foundation of a material which contracts in the liquid state.
Figure 6B:
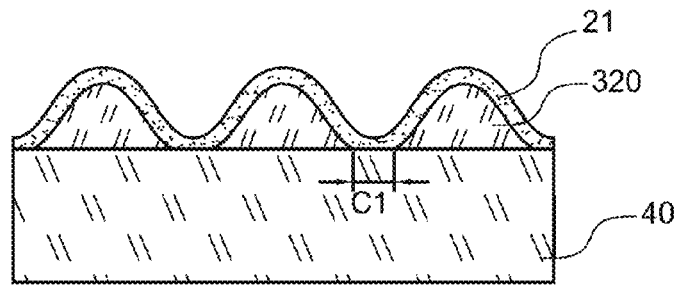

FIG. 6a represents the initial structure 100 consisting of the substrate 40, the foundation 30 and the strained elastic thin layer 20. FIG. 6b represents the structure obtained following the melting and solidification steps described above to result in the formation of fixed wrinkles and a localized adherent contact of the wrinkled thin layer 21 with the substrate 40 separating regions of the wrinkled solid foundation. A zone of localized adherent contact between the thin layer and the substrate forms an interval separating two adjacent regions of the foundation which extends on a distance C1.

Figure 6C:
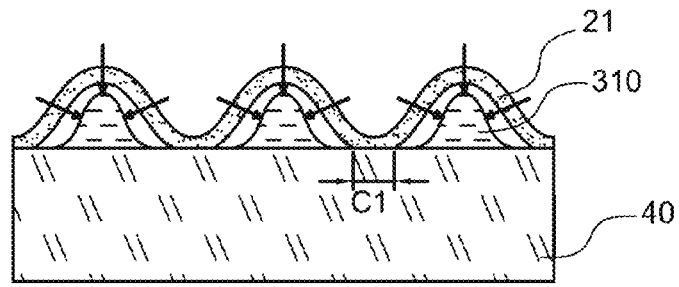
Figure 6D:
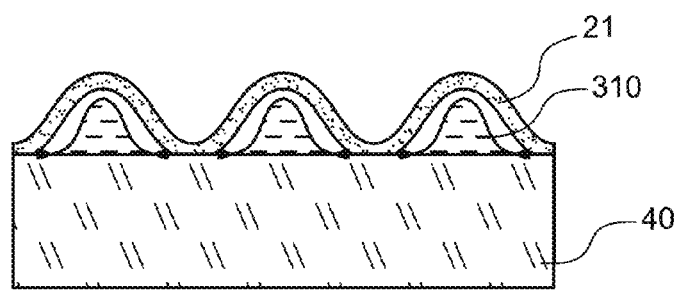
Figure 6E:
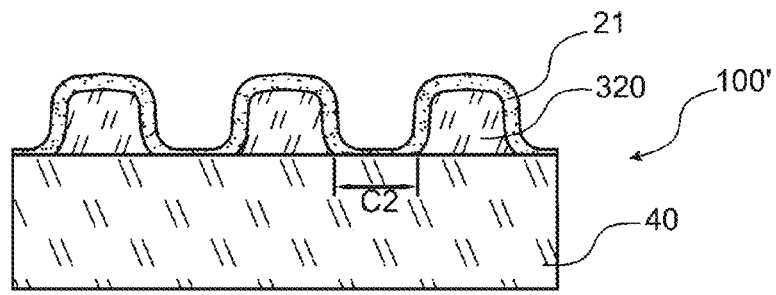

Within the scope of this alternative, the melting and solidification steps can be reiterated. By taking the example of a foundation of a material which has the property to be contracted in volume upon switching from its solid state to its liquid state (as is the case for example of the following materials: Si, Ga, Ge, Pu, Sb, $\alpha$-$ZrW_2O_8$, $C_2N_2Zn$, $H_2O$), within the scope of this alternative, the melting and solidification steps are reiterated such that the smaller volume in the liquid phase of the foundation 310, illustrated in FIG. 6c, is accompanied by an adherent contact of the thin layer 21 with the substrate 40 on a higher distance, which promotes adhesion as represented in FIG. 6d. As a result, after solidification, there is the structure 110' represented in FIG. 6e for which the interval C2 between the separated regions of the foundation is enhanced and the amplitude of the wrinkles is increased.

Figure 7:
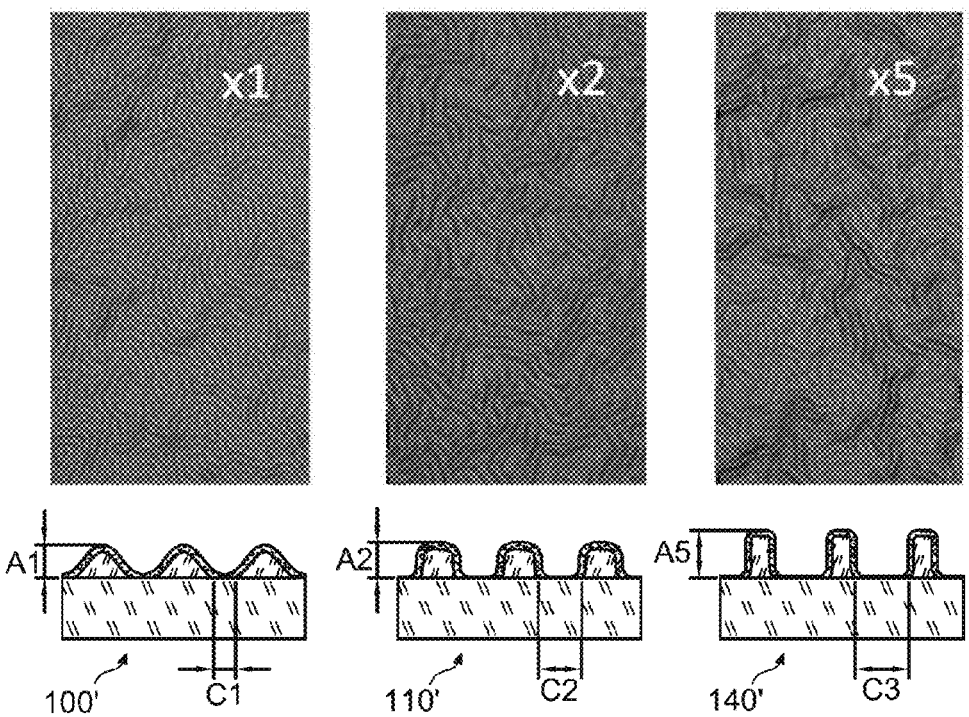
FIG. 7 represents wrinkles formed at the surface of a substrate according to the number of reiterations of the melting and solidification steps that can be implemented within the scope of the invention.

As represented in FIG. 7, it is possible to reiterate several times the melting and solidification steps, as long as the thin layer resists to deformation. Adherence works of the thin layer and the substrate thin the insulated regions of the foundation in the structures 100', 110', 140' formed (after respectively 1, 2 and 5 melting/solidification sequences from left to right in FIG. 7) which have their amplitude A1, A2, A5 gradually increased whereas the interval C1, C2, C5 separating the isolated regions increases. The separated regions have the advantage to be smooth because they come from a liquid phase and thus have less defects in comparison with lithographic methods followed by etching. Reiterating the melting step further enables the adhesion of the zones of localized adherent contact C1, C2, C5 with the substrate to be enhanced.

It is seen within the scope of this alternative of the invention to limit the number of reiterations of the melting and solidification steps such that the thin layer resists to deformation stresses. And removing the foundation can be made following several reiterations of the melting and solidification steps.

Indeed, since the deformation of the skin has a limit, during a reiteration of the melting step, the liquid is further confined and the return to the solid state results in a too high pressure rise. This results in the rupture of the thin layer in the zone where the stress is maximum, that is at the maximum amplitude of the wrinkles. This rupture is accompanied by the eruption of the molten liquid from the foundation. This liquid can flow out along the skin. If the conditions are met, and in particular if the melting material has a low wettability relative to the skin surface material (typically corresponding to a drop angle higher than 80°), a nanoscale ball of material can be formed on top of the crater.

The invention is not restricted to the method as previously described, but also extends to any structure consisting of an undulated layer locally lying on a substrate obtained by deforming a bilayer lying on the substrate and comprising a foundation and a strained elastic layer, the deformation generating wrinkles at the surface of the bilayer and a localized adherent contact of the elastic layer with the substrate, and by removing the foundation following said deformation.

The invention claimed is:

1. A method for forming an elastic undulated layer locally lying on a substrate from a structure including a strained elastic layer on a foundation in a solid state present at a surface of a rigid substrate, the foundation made of a material other than a polymeric material, the method comprising:
    melting the foundation to bring the foundation to a liquid state for a duration higher than or equal to 50 ns, thickness of the foundation being at least 20 nm and lower than a predetermined thickness corresponding to a theoretical peak-to-peak amplitude of wrinkles, the melting resulting in a stress relaxation of the elastic layer which generates a simultaneous deformation, by formation of wrinkles, of the elastic layer and of the foundation, the formation of the wrinkles separating regions of the foundation between zones of localized adherent contact between the elastic layer and the rigid substrate;
    solidifying the foundation to bring the foundation back to the solid state, the solidification forming a solid structure having wrinkles at the surface; and
    removing the separated regions of the foundation brought back to the solid state to suspend a layer above the substrate outside of the zones of localized adherent contact, the suspended layer being undulated in accordance with the wrinkles at the surface of the solid structure, said removing being made by chemical etching of the foundation, said chemical etching being selective with respect to the rigid substrate and with respect to the undulated suspended layer being in adherent contact with the rigid substrate at the zones of localized adherent contact such that the rigid substrate and the undulated suspended layer are not removed by the chemical etching.

2. The method according to claim 1, wherein the melting is made by a selective energy supply by which energy is absorbed by at least part of the foundation rather than by the elastic layer with a ratio of 100/1.

3. The method according to claim 1, wherein the melting is made by a selective energy supply by which energy is absorbed by at least part of the foundation rather than by the elastic layer with a ratio of 1000/1.

4. The method according to claim 1, wherein the duration of each of the melting and solidification is lower than 1 microsecond.

5. The method according to claim 1, wherein the duration of each of the melting and solidification is lower than 1 second.

6. The method according to claim 1, wherein the rigid substrate comprises a thermally insulating superficial layer.

7. The method according to claim 1, wherein the foundation is electrically conducting and inserted between electrically insulating materials, and the melting of at least one part of the foundation is made by a thermal energy supply making use of joule effect.

8. The method according to claim 1, wherein the foundation is inserted between electrically insulating materials and has a resistivity higher than that of the electrically insulating materials, the melting of at least one part of the foundation is made by a thermal energy supply making use of a resistive heating.

9. The method according to claim 1, wherein the melting and solidification are reiterated before the removing the foundation brought back to the solid state, to gradually increase at each reiteration an amplitude of the wrinkles and an interval between the separated regions of the foundation without reaching a yield point of the strained elastic layer.

10. The method according to claim 1, wherein the suspended layer is formed by the elastic layer.

11. The method according to claim 1, further comprising, after solidifying the foundation and before removing the foundation, removing the elastic layer and depositing a new layer at the surface of the solid structure, so that, after said removing of the foundation, the new layer forms the suspended layer.

12. The method according to claim 1, wherein the elastic layer initially has a stress having a discontinuity in the plane of the layer.

13. The method according to claim 12, further comprising creating patterns at the surface of the elastic layer and/or of the foundation to induce the discontinuity.

* * * * *